United States Patent
Chun

(10) Patent No.: US 8,069,559 B2
(45) Date of Patent: Dec. 6, 2011

(54) METHOD OF ASSEMBLING AN INSULATED METAL SUBSTRATE

(75) Inventor: Seung B. Chun, Pomfret Center, CT (US)

(73) Assignee: World Properties, Inc., Lincolnwood, IL (US)

( * ) Notice: Subject to any disclaimer, the term of this patent is extended or adjusted under 35 U.S.C. 154(b) by 708 days.

(21) Appl. No.: 12/195,939

(22) Filed: Aug. 21, 2008

(65) Prior Publication Data

US 2009/0050355 A1     Feb. 26, 2009

Related U.S. Application Data

(60) Provisional application No. 60/957,779, filed on Aug. 24, 2007.

(51) Int. Cl.
*H05K 3/34* (2006.01)

(52) U.S. Cl. ............... 29/840; 29/831; 29/832; 29/846; 29/847; 29/852

(58) Field of Classification Search .............. 29/840, 29/832, 831, 846, 842, 860, 25.42, 25.41; 428/416, 418, 663, 675; 174/257, 255, 264, 174/355
See application file for complete search history.

(56) References Cited

U.S. PATENT DOCUMENTS

| | | | | |
|---|---|---|---|---|
| 5,716,713 | A * | 2/1998 | Zsamboky et al. | 428/457 |
| 5,800,724 | A | 9/1998 | Habeger et al. | |
| 7,303,005 | B2 | 12/2007 | Reis et al. | |
| 7,365,988 | B2 | 4/2008 | Reis et al. | |
| 7,416,019 | B2 * | 8/2008 | Osiander et al. | 165/96 |
| 2003/0221860 | A1 | 12/2003 | Van Der Burgt et al. | |
| 2004/0234699 | A1 * | 11/2004 | Hale et al. | 427/421.1 |
| 2006/0048963 | A1 | 3/2006 | Nishinaka et al. | |
| 2006/0185140 | A1 * | 8/2006 | Andresakis et al. | 29/25.41 |
| 2006/0231837 | A1 * | 10/2006 | Wuchse et al. | 257/59 |

FOREIGN PATENT DOCUMENTS

WO   PCT/US2008/059983     4/2008

OTHER PUBLICATIONS

International Search Report and Written Opinion for PCT application No. PCT/US2008/073955 filed on Aug. 22, 2008.

\* cited by examiner

*Primary Examiner* — Derris Banks
*Assistant Examiner* — Tai Nguyen
(74) *Attorney, Agent, or Firm* — Cantor Colburn LLP

(57) ABSTRACT

An insulated metal substrate laminate includes a metal substrate, a dielectric layer disposed upon the metal substrate, wherein the dielectric layer comprises a thermoplastic film having a thickness of less than or equal to 10 micrometers, a thermal resistance of less than or equal to 0.050 Kelvin-square inches per watt, and a breakdown voltage greater than or equal to 1000 volts (alternating current), and an electrically conductive layer disposed upon the dielectric layer.

14 Claims, 1 Drawing Sheet

METHOD OF ASSEMBLING AN INSULATED METAL SUBSTRATE

CROSS-REFERENCE TO RELATED APPLICATIONS

This application claims the benefit of U.S. Provisional Application Ser. No. 60/957,779 filed Aug. 24, 2007, which is incorporated herein by reference in its entirety.

BACKGROUND

This disclosure relates to insulated metal substrates having thermoplastic films for dielectric layers, and methods of manufacture thereof.

An insulated metal substrate (IMS) includes metal traces, a dielectric layer, and a metal substrate. Polymer films have been used as the dielectric layer in IMS laminates, but polymer films are generally poor thermal conductors. Typical thermal conductivities for polymer films can be about 0.2 to about 0.25 watts per meter-Kelvin (W/mK). To make the polymer films more thermally conductive, conductive particles, such as ceramic fillers, are added. The filled polymer films, however, have lower breakdown voltages per mil thickness than their unfilled counterparts. Breakdown voltage is a characteristic of an insulator that defines the maximum voltage difference that can be applied across the material before the insulator collapses and conducts. As such, a thicker polymer film, in some cases greater than 75 microns, is needed to satisfy breakdown voltage requirements for the IMS laminate. Moreover, the use of thermally conductive particles can be expensive, and the subsequent dielectric layer must also be thick enough to ensure it is pin-hole free. Because the filled thermoplastic dielectric layers are so thick, they add thermal resistance to the design. Examples of IMS laminates using filled polymer films for dielectric layers are Bergquist Insulated Metal Substrate® thermal boards and Denka HITT® plate boards. The dielectric layer of each of these IMS laminates are epoxy-glass or epoxy-alumina based and have thermal resistance values of about 0.05 Kelvin square inches per watt ($K\ in^2/W$).

Some IMS laminates utilize unfilled polymer films, such as polyimide (PI) film. These unfilled polymer films, however, still have to be thick enough to satisfy breakdown voltage requirements, and therefore, have higher thermal resistance values. For example, PI film manufactured by Kaneka, such as Pixeo FC-622, can have a thickness of 14 microns and a thermal resistance of $0.10\ K\ in^2/W$. Still not an optimal thermal resistance value for an IMS laminate.

In another attempt to circumvent the problem, dielectric layers have been made thermally conductive through the addition of a thin anodization layer on top of an aluminum heat spreader layer. An example of such IMS laminates are Anotherm® boards produced by TT Electronics®. The use of anodization as the dielectric layer attempts to overcome some of the issues associated with thick, filled thermoplastic dielectric layers, but forces the use of aluminum as its heat spreader layer, since copper cannot be anodized. Since the thermal conductivity of aluminum is significantly less than that of copper, this can be another thermal disadvantage. Additional limitations of this approach arise from the lack of flexibility to fabricate bent or non-planar circuit structures, and the fact that the dielectric material covers the entire surface of the heat spreader layer.

Moreover, all of the foregoing approaches, can suffer soldering difficulties, since the same heat dissipation properties that are useful during the operation of the printed circuit board and components, inhibit an assembly process that requires point sources of heat for soldering (such as hot bar bonding, for example).

Accordingly, there remains a need in the art for improved IMS laminates utilizing a thin thermoplastic film which does not so significantly increase the thermal resistance and lower the breakdown voltage of the dielectric layer.

BRIEF SUMMARY

Disclosed herein is an insulated metal substrate laminate including a metal substrate, a dielectric layer disposed upon the metal substrate, wherein the dielectric layer comprises a thermoplastic film having a thickness of less than or equal to 10 micrometers, a thermal resistance of less than or equal to 0.050 Kelvin-square inches per watt, and a breakdown voltage greater than or equal to 1000 volts (alternating current), and an electrically conductive layer disposed upon the dielectric layer.

In another embodiment, a method of assembling an insulated metal substrate laminate, includes placing the dielectric layer upon a metal substrate, wherein the dielectric layer comprises a thermoplastic film having a thickness of less than or equal to 10 micrometers, a thermal resistance of less than or equal to 0.050 Kelvin-square inches per watt, and a breakdown voltage greater than or equal to 1000 volts (alternating current), placing an electrically conductive layer upon the dielectric layer, and laminating the electrically conductive layer, the dielectric layer, and the metal substrate together by applying a pressure of at least about 300 pounds per square inch at a temperature of at least about 460 degrees Fahrenheit for at least about 10 minutes to form the insulated metal substrate laminate.

Another method of assembling an insulated metal substrate laminate, includes placing a dielectric layer upon a metal substrate sheet, wherein the dielectric layer comprises a thermoplastic film having a thickness of less than or equal to 10 micrometers, a thermal resistance of less than or equal to 0.050 Kelvin-square inches per watt, and a breakdown voltage greater than or equal to 1000 volts (alternating current), placing an electrically conductive foil upon the dielectric layer, and feeding the electrically conductive foil, the dielectric layer, and the metal substrate sheet between two or more rolls and laminating the electrically conductive layer, the dielectric layer, and the metal substrate together by applying a pressure of at least about 300 pounds per square inch at a temperature of at least about 460 degrees Fahrenheit for at least about 10 minutes to form the insulated metal substrate laminate.

DETAILED DESCRIPTION

Figure 1:
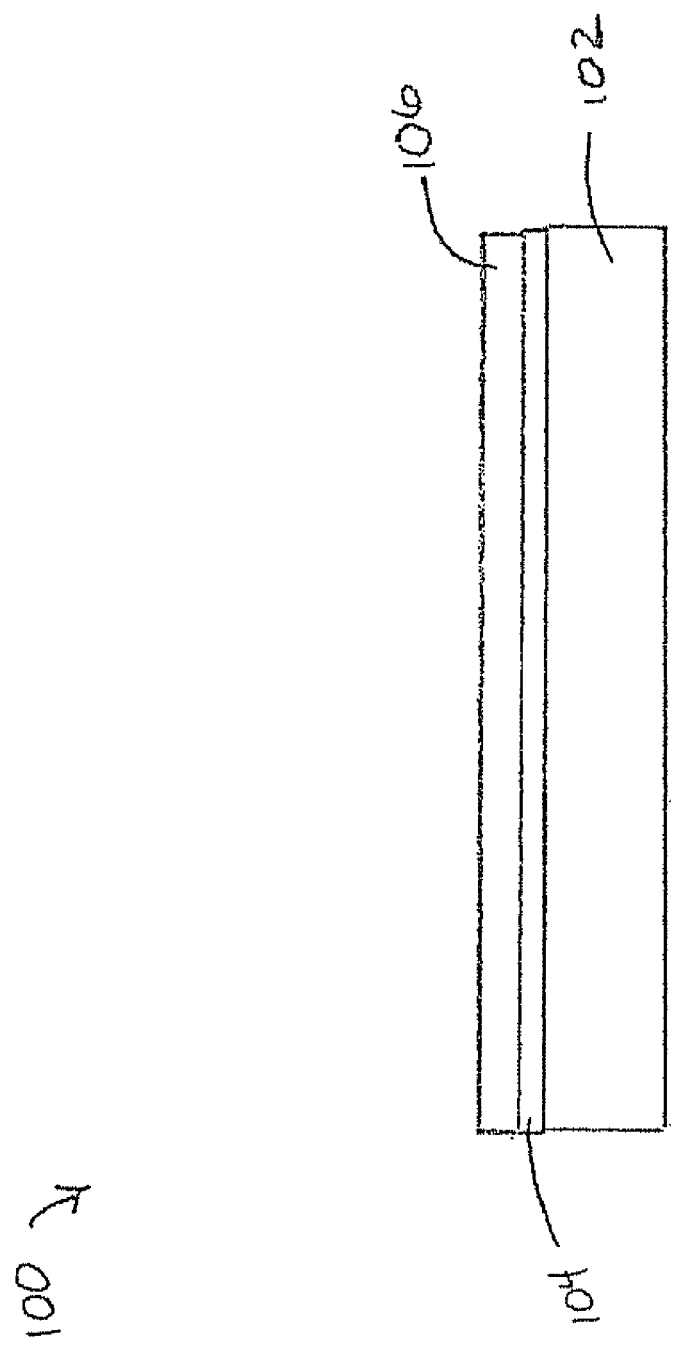
FIG. 1 is a cross-sectional view of an exemplary embodiment of an insulated metal substrate laminate.

The inventors hereof have found that by using an ultra-thin thermoplastic film for the dielectric layer in an insulated metal substrate (IMS), the IMS will have both improved thermal resistance and breakdown voltage. Moreover, the ultra-thin thermoplastic film can be added to the IMS laminate as a dielectric layer using a roll-to-roll process. In one embodiment, the disclosed IMS laminate has a thinner thermoplastic film dielectric layer, with lower thermal resistance, and can be fabricated more easily at lower cost when compared with current IMS laminates, such as those having thicker dielectric layers. The IMS, as disclosed herein, are particularly suitable for use as capacitors, such as embedded or distributed capacitors in multi-layer printed circuit boards.

Turning now to FIG. 1, an IMS laminate 100 is illustrated. The IMS laminate 100 comprises a metal substrate 102 with a dielectric layer 104 disposed thereon. An electrically conductive layer 106 is arranged on the dielectric layer 104. Both the dielectric layer 104 and the electrically conductive layer 106 form a circuit board. An electrical component (not shown) can be mounted to the surface of the IMS laminate 100 in electrical communication with the electrically conductive layer 106. The electrically conductive layer 106 may be electrically engaged to the electrical component with solder. A power supply can further be in electrical communication with the electrically conductive layer 106 to provide power to the electrical component.

The metal substrate 102 generally comprises a material that exhibits excellent thermal conduction. Suitable materials include, without limitation, aluminum, copper, stainless steel, copper-beryllium, tin-plated copper, and the like. The metal substrate can have any shape and thickness suitable for a given application as would be known to one of skill in the art. In one embodiment, the metal substrate 102 can have a thickness of about 20 mil to about 200 mil.

The IMS laminate 100 further comprises the dielectric layer 104 disposed on the metal substrate 102. The dielectric layer 104 comprises a solid component comprised of dielectric material, which can be cut and shaped to any suitable size and shape for a given application. As used herein, the term "dielectric" is used to describe electrically insulating material having good bond strength with circuit traces and the metal substrate, high breakdown voltage, low moisture absorption, and the like. In one embodiment, the dielectric layer can be a thermoplastic film having a thickness of less than or equal to 10 micrometers (microns). The ultra-thin thermoplastic film (i.e., less than 10 microns) dielectric layer has a thermal resistance of less than or equal to 0.050 Kelvin-square inches per watt (K in$^2$/W).

In a particular embodiment, the ultra-thin thermoplastic film is 6 micron polyether ether ketone (PEEK) film, such as that produced by Victrex®. Applicants have unexpectedly found that ultra-thin thermoplastic film, such as the 6-micron PEEK film, has a thermal resistance of about 0.035 to 0.050 K in$^2$/W while maintaining desirable dielectric properties, such as breakdown voltage equal to or higher than 1000 volts alternating current ($V_{ac}$), and can be as high as about 2000 volts. The ultra-thin PEEK film also has a thermal resistance of about 0.25 W/mK. The ultra-thin PEEK film not only has improved thermal resistance, breakdown voltage, and dielectric strength over the current dielectric layers as described above, but it also has improved bond to metal foil, such as copper (e.g., copper peel is greater than 6 pounds per linear inch), improved moisture absorption (0.5%) over PI, as well as a higher melting point (649° F.). The ultra-thin PEEK film is insoluble in many commonly used solvents and provides chemical resistance to acids, bases, oxidizing agents, hydrocarbons, salts, and steam.

Furthermore, for environmental reasons, manufacturers of electronic devices also seek to essentially eliminate the use of chlorinated and brominated flame retardants to achieve a UL-94 V0 flammability rating. These requirements for high temperature resistant materials that are flame retardant without brominated or chlorinated additives create a need for new types of circuit substrates. The ultra thin PEEK film described herein, such as the 6-micron film produced by Victrex®, is halogen-free. Since one of the significant advantages of using PEEK is its flame retardancy, in one embodiment, the IMS laminates disclosed herein comprise no added flame retardant, in particular no halogentated flame retardant, and even more particularly, no chlorinated and/or brominated flame retardant. It is nonetheless possible, in other embodiments, to include a non-halogenated flame retardant, especially an inorganic flame retardant such as magnesium hydroxide. An organic phosphorus-containing flame retardant can be present, instead of or in addition to the inorganic flame retardant. Where a halogenated flame retardant is present, chlorinated and/or brominated flame retardants such as ethylene bistetrabromophthalimide, tetradecabromodiphenoxy benzene, and/or decabromodiphenoxyl oxide can be used.

The electrically conductive layer 106 is arranged on the ultra-thin thermoplastic film dielectric layer 104. The electrically conductive layer 106 provides a electrically conductive surface for establishing conductive paths for interconnecting electrical components to the IMS laminate. The electrically conductive layer 106 is a solid component, which can be cut and shaped to any suitable size and shape for a given application. For example, the electrically conductive layer 106 can comprise a metal foil. Suitable metal foils include copper foil, tin-plated copper foil, silver foil, gold foil, and the like. In one embodiment, the electrically conductive layer 106 can be formed of CopperBond copper foil, commercially available from Olin.

An exemplary method of assembling the IMS laminate includes placing the dielectric layer upon the metal substrate, placing the electrically conductive layer upon the dielectric layer, and laminating the two layers and the substrate together. The IMS components are laminated together by applying pressure to the components at a pressure and for a period of time appropriate to create a bond between the layers of the IMS laminate depending on the material chosen for the dielectric layer. In one method, the IMS laminate is placed in a heated pneumatic platen press. The IMS laminate is then subjected to a pressure of about 300 pounds per square inch (psi) to about 1500 psi for a period of about 10 minutes to about 60 minutes at a temperature of about 340 degrees Celsius (° C.) (644° F.) to about 360° C. (680° F.). In one exemplary embodiment, laminating the electrically conductive layer, the dielectric layer, and the metal substrate together is done at a pressure of about 1200 psi at a temperature of about 680° F. for about 45 minutes to form the insulated metal substrate laminate. The operating temperature of the heated press will depend upon the ultra-thin thermoplastic film selected to form the dielectric layer of the IMS laminate. Also, in one method, the IMS components are laminated in the heated press under vacuum. The IMS laminate can then be removed from the press and the desired electrical components can be connected to the IMS laminate via a soldering process, such as reflow soldering.

In an additional step, apertures can be formed in the electrically conductive layer and the dielectric layer. As used herein, the term "formed" is used to generally refer to means for creating an aperture, such as without limitation, cutting, drilling, punching, die-cutting, and the like. Also, the apertures as disclosed herein, are not intended to be limited in size or shape. As used herein, the term "aperture" is intended to refer to a portion of the dielectric layer or the electrically conductive layer removed from the top surface to the bottom surface. Exemplary apertures include, without limitation, vias, thru-holes, channels, contacts, and the like. In one embodiment, apertures can be die-cut in both the electrically conductive layer and the dielectric layer simultaneously. The pre-cut electrically conductive layer and dielectric layer are then placed in contact with the metal substrate for all the components to be laminated together to form the IMS laminate.

In one exemplary embodiment, wherein the dielectric layer comprises the ultra thin PEEK film, the IMS laminate as disclosed herein holds certain advantages over existing IMS laminates. For example, when using ultra thin PEEK film, the apertures as mentioned above can be made in the IMS laminate using laser ablation, rather than mechanical punching or drilling. Laser ablation is the process of removing material from a solid surface by irradiating it with a laser beam. Surface mount compatible holes, therefore, can more easily be made in the IMS laminates. The ultra thin PEEK film is also mechanically robust, meaning it is not brittle and produces little dust as the surface mount holes are formed. In another example, the ultra thin PEEK film does not require adhesive in order to bond to the copper electrically conductive layer. Unlike PI, where a layer of adhesive must be disposed between the PI dielectric film and the copper electrically conductive layer to facilitate bonding, there is no need for adhesive when using the ultra thin PEEK film. Elimination of the dielectric to metal foil adhesive simplifies IMS laminate production and reduces material costs.

In an alternative method of assembling the IMS laminate, a roll-to-roll process is utilized. The electrically conductive layer is fed as the top foil, the dielectric layer is the middle film, and the metal substrate provides the bottom sheet. In an exemplary embodiment of the method, all three layers are simultaneously and continuously fed through two or more rolls and are laminated under heat and pressure. The IMS laminate can then be cut as desired and electrical components can be connected to the laminate in subsequent process steps. Current processing techniques, as well as the method described above, requires stacking an aluminum plate, a sheet of film, and a sheet of copper foil between a pair of caul plates, and then placing the assembly in a press where pressure and heat is applied. The process can take up to an hour to lay up ten IMS laminates. Part of the time constraint is because the dielectric film and the conductive foil must be cut into sheets prior to being placed in the press. The roll-to-roll process method can be employed in assembling the disclosed IMS laminates because the thin film and the conductive foil are available in roll form and, therefore, the IMS laminates can be assembled in a continuous manner. In fact, the roll-to-roll processing advantageously eliminates the difficulty in handling such thin thermoplastic films in sheet form. Advantageously, the method as disclosed herein requires less time, labor, and energy when compared to existing methods of producing IMS laminates. As a result, the cost of producing the disclosed IMS laminate comprising an ultra-thin thermoplastic film dielectric layer is lower than IMS laminates produced by current methods because the ultra-thin thermoplastic film can be applied using a roll-to-roll process.

The following example, which is meant to be exemplary, not limiting, illustrates a method of manufacturing the IMS laminates described herein.

Example 1

In this example, an IMS laminate was produced by the following method. A 1-ounce (oz.) CopperBond copper foil was placed on top of a 6 micron Victrex PEEK ultra-thin thermoplastic film. The foil and thermoplastic film dielectric layer were then placed on a 63-mil aluminum plate. The three-layer assembly was then placed in a heated press. The press was closed and a pressure of 1200 psi at a temperature of 680° F. for a duration of 45 minutes was placed on the IMS layers to produce the IMS laminate.

The terms "first," "second," and the like as used herein do not denote any order, quantity, or importance, but rather are used to distinguish one element from another. The terms "a" and "an" do not denote a limitation of quantity, but rather denote the presence of at least one of the referenced item. The modifier "about" used in connection with a quantity is inclusive of the stated value and has the meaning dictated by the context (e.g., includes the degree of error associated with measurement of the particular quantity). Further as used herein "disposed" means that the recited elements are in direct contact with, and fully or partially cover each other. All ranges disclosed within this specification that are directed to the same component or property are inclusive of the stated endpoint, and are independently combinable. All references are incorporated herein by reference in their entirety.

While the invention has been described with reference to exemplary embodiments, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof Therefore, it is intended that the invention not be limited to the particular embodiment disclosed as the best mode contemplated for carrying out this invention.

What is claimed is:

1. A method of assembling an insulated metal substrate laminate, comprising:
    placing a dielectric layer upon a metal substrate, wherein the dielectric layer comprises a thermoplastic film having a thickness of less than or equal to 10 micrometers, a thermal resistance of less than or equal to 0.050 Kelvin-square inches per watt, and a breakdown voltage greater than or equal to 1000 volts (alternating current);
    placing an electrically conductive layer upon the dielectric layer; and
    laminating the electrically conductive layer, the dielectric layer, and the metal substrate together by applying a pressure of at least about 300 pounds per square inch at a temperature of at least about 460 degrees Fahrenheit for at least about 10 minutes to form the insulated metal substrate laminate.

2. The method of claim 1, further comprising soldering an electrical component to the electrically conductive layer of the insulated metal substrate laminate.

3. The method of claim 1, wherein the electrically conductive layer comprises copper, tin-plated copper, silver, gold, or a combination comprising at least one of the foregoing.

4. The method of claim 1, wherein the thermoplastic film comprises a polyether ether ketone.

5. The insulated metal substrate laminate of claim 4, wherein the dielectric layer is free of halogens.

6. The method of claim 1, wherein the metal substrate comprises aluminum, copper, tin-plated copper, copper-beryllium, stainless steel, or a combination comprising at least one of the foregoing.

7. A method of assembling an insulated metal substrate laminate, comprising:
    placing a dielectric layer upon a metal substrate sheet, wherein the dielectric layer comprises a thermoplastic film having a thickness of less than or equal to 10 micrometers, a thermal resistance of less than or equal to 0.050 Kelvin-square inches per watt, and a breakdown voltage greater than or equal to 1000 volts (alternating current);

placing an electrically conductive foil upon the dielectric layer; and feeding the electrically conductive foil, the dielectric layer, and the metal substrate sheet between two or more rolls and laminating the electrically conductive layer, the dielectric layer, and the metal substrate together by applying a pressure of at least about 300 pounds per square inch at a temperature of at least about 460 degrees Fahrenheit for at least about 10 minutes to form the insulated metal substrate laminate.

8. The method of claim 7, wherein the feeding and the laminating are continuously done to form a plurality of insulated metal substrates.

9. The method of claim 7, further comprising soldering an electrical component to the electrically conductive layer of the insulated metal substrate laminate.

10. The method of claim 7, wherein the electrically conductive layer comprises copper, tin-plated copper, silver, gold, or a combination comprising at least one of the foregoing.

11. The method of claim 7, wherein the thermoplastic film comprises a polyether ether ketone.

12. The method of claim 11, wherein the polyether ether ketone has a film thickness of about 6 micrometers.

13. The method of claim 11, wherein the dielectric layer is free of halogens.

14. The method of claim 7, wherein the metal substrate comprises aluminum, copper, tin-plated copper, copper-beryllium, stainless steel, or a combination comprising at least one of the foregoing.

* * * * *